United States Patent [19]

Bertoldi et al.

[11] Patent Number: 5,001,681
[45] Date of Patent: Mar. 19, 1991

[54] MONOLAMINAR PIEZOELECTRIC BENDER BAR

[75] Inventors: John K. Bertoldi; Manuel A. Gonzalez, both of Seattle, Wash.

[73] Assignee: Honeywell Inc., Minneapolis, Minn.

[21] Appl. No.: 454,226

[22] Filed: Dec. 21, 1989

[51] Int. Cl.⁵ .............................................. H04R 17/00
[52] U.S. Cl. .................................... 367/160; 310/330; 310/359; 367/164
[58] Field of Search ............... 367/155, 157, 158, 159, 367/160, 161, 164; 310/328, 330, 334, 337, 359

[56] References Cited

U.S. PATENT DOCUMENTS 4,633,204 12/1986 Gounji et al. ..................... 370/359
4,878,207 10/1989 Joundera et al. ................ 367/158 X Primary Examiner—Brian S. Steinberger
Attorney, Agent, or Firm—Whitham & Marhoefer

[57] ABSTRACT

A single stack of double poled piezoelectric ceramic elements (202) create a monolaminar bender bar (200) which can be used in acoustic applications. The stack is lined up such that adjacent elements (202) in bender bar (200) have oppositely poled top and bottom sections. A positive voltage (230) in connected to electrical connection plates (214) which are positioned between every other piezoelectric element (202) in the stack and a negative voltage (232) is connected to electrical connection plates (214) which are between the remaining piezoelectric elements (202). Applying a voltage causes the stack to bend, wherein the piezoelectric elements (202) in the top half of the bender bar (200) all expand while the piezoelectric elements (202) in the bottom half of the bender bar (200) all contract.

5 Claims, 3 Drawing Sheets

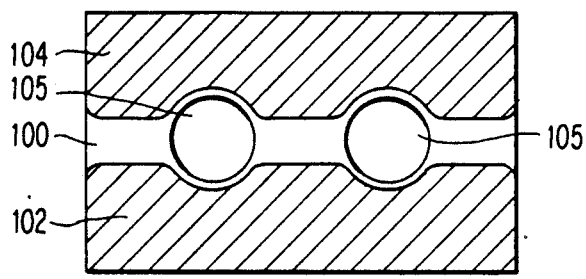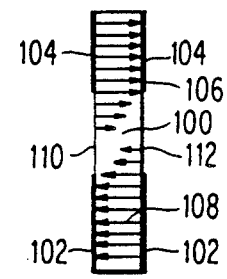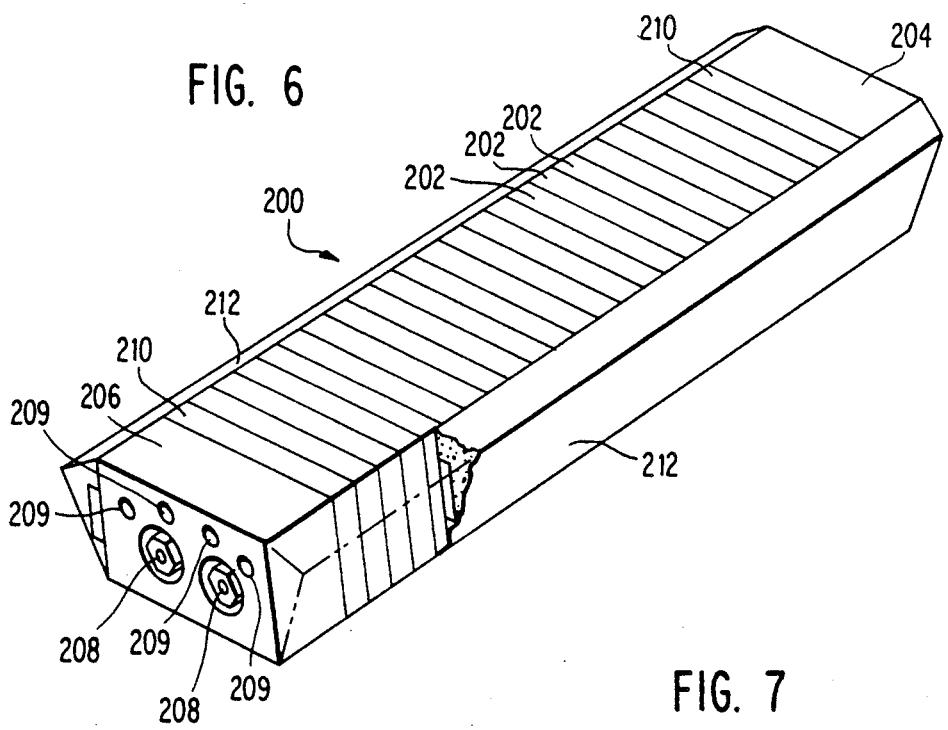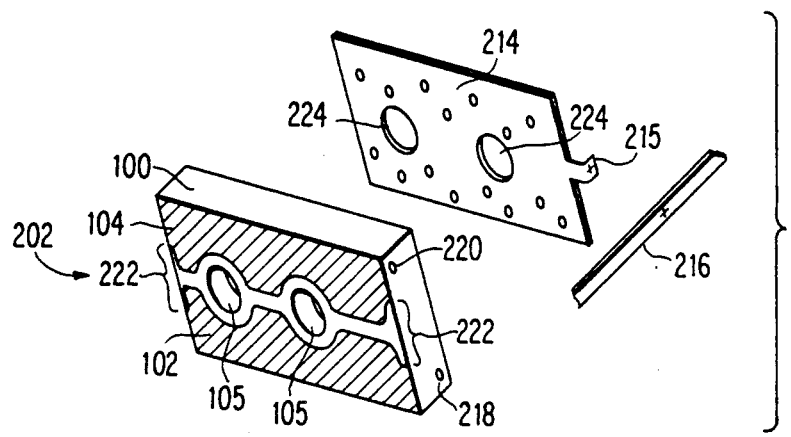

MONOLAMINAR PIEZOELECTRIC BENDER BAR

CROSS-REFERENCE TO RELATED APPLICATIONS

This application is related to the following co-pending application which is assigned to a common assignee and is incorporated herein by reference:

"Double Poled Piezoelectric Ceramic Element", Ser. No. 07/454,579, filed Dec. 21, 1989.

BACKGROUND OF THE PRIOR ART

1. Field of the Invention

The subject invention is directed to the field of piezoelectric bender bar acoustic transducers. More particularly, the invention is concerned with the construction of a bender bar from particular piezoelectric elements.

2. Description of the Prior Art

A "bender bar" is a particular type of acoustic transducer which is well known in the art and has been used in underwater sonar applications as well as in borehole monitoring for oil and gas exploration. Today's bender bars are comprised of two stacks of piezoelectric elements which are held together either in a side by side relationship or are attached to opposite sides of an insulative support. The individual piezoelectric ceramic elements in each stack are "poled" so that they either expand or contract upon the application of electric current. The "poling process" is well known in the art and can be defined as the process of exposing a piezoelectric ceramic element to a high voltage current when it is held at its Curie point temperature. The poling process aligns the dipoles of the ceramic in one direction such that the piezoelectric ceramic element will expand if a voltage is applied across the positively poled direction and will contract if voltage is applied across the negatively poled direction.

FIGS. 1 and 2 show the construction of a bender bar 10 and its flexibility under an applied voltage, respectively. FIG. 1 shows the individual piezoelectric ceramic elements 12 are held tightly together between steel end blocks 14 and 16 by stress rods 18 positioned in side rails 20. FIG. 2 shows the positive 22 and negative 24 poles of each piezoelectric ceramic element 12 are electrically connected to a power source 26 or 28. The electrical connection is such that the positive terminal 30 of power source 26 is connected to the positive 22 poled side and the negative terminal 32 is connected to the negative 24 poled side of each piezoelectric ceramic element 12 in the top row. In contrast, the positive terminal 36 and negative terminal 38 of power source 28 are connected to the negative 24 and positive 22 poles, respectively, of each piezoelectric ceramic element 12 in the bottom row. By holding the piezoelectric ceramic elements 12 tightly together with stress rods 18, as shown in FIG. 1, the bilaminar bender bar 10 is caused to flex when each piezoelectric element 12 in the top row expands and each piezoelectric element 12 in the bottom row contracts under an applied voltage, as shown in FIG. 2. The degree and timing of flexing of the bilaminar bender bar 10 can be controlled such that pulsed information can be transmitted to an acoustic media. Likewise, sonic waves which impinge on the bender bar 10 can cause it to flex and the degree of flexure can be translated into a corresponding electrical signal which can be sensed to discern acoustic information.

FIG. 3 shows a trilaminar bender bar 50 which includes several piezoelectric ceramic elements 52 and 53 laminated to opposite sides of a central core 54 of insulative material. Stress rods (not shown) passing through the central core 54 serve to tightly hold the piezoelectric ceramic elements 52 and 53 between steel end blocks 56 and 58. The trilaminar bender bar 50 is secured inside an acoustic instrument such as a hydrophone using the mounting holes 60 in the end block 56. The piezoelectric elements 52 and 53 of the trilaminar bender bar 50 can be electrically connected as described above in conjunction with FIG. 2 such that the bender bar 50 will flex under an applied voltage and act as an acoustic transducer. The poled ends of piezoelectric elements 52 and 53 do not need to be arranged in exactly the same manner as are piezoelectric ceramic elements 12 shown in FIG. 2; rather, all that is required for providing the flexing feature of an acoustic bender bar transducer is that one stack of piezoelectric elements 52 expands under an applied voltage while the other stack of piezoelectric ceramic elements 53 contracts under the applied voltage.

Bilaminar and trilaminar bender bars are expensive to manufacture because the many pieces required to fabricate a bender bar translate into high assembly costs. Two separate stacks of piezoelectric elements must be assembled and then those two stacks must either be cemented together or laminated to opposite sides of a central core. Reducing the number of pieces required for assembling a bender bar would substantially reduce the costs of production. In addition, in both the bilaminar and trilaminar bender bar designs the stress rods must act from a position exterior to the piezoelectric ceramic elements. Such positioning of the stress rods can make control of the mechanical stress placed on the piezoelectric ceramic elements difficult and can reduce the maximum achievable mechanical stress.

SUMMARY OF THE INVENTION

It is therefore an object of this invention to provide a monolaminar bender bar comprised of a plurality of double poled piezoelectric ceramic elements where the stress rods pass through the center of each piezoelectric ceramic element.

According to the invention, a monolaminar bender bar transducer is comprised of a plurality of double poled piezoelectric ceramic elements arranged in a stack. Each of the double poled piezoelectric ceramic elements is fabricated such that one half has a polarization vector in a first direction and the other half has a polarization vector in the opposite direction. Electrodes are connected to each half of each piezoelectric ceramic element. Application of a voltage causes one half of each piezoelectric ceramic element to expand and causes the other half to contract; thereby causing the entire stack of piezoelectric elements to flex as is required by any bender bar transducer. Since only one stack of piezoelectric ceramic elements is required rather than two, the assembly costs for the bender bar are reduced by half or more relative to bilaminar and trilaminar bender bars.

In addition, a pair of openings are drilled through each piezoelectric ceramic element to accommodate a pair of stress rods. Since the bender bar stress rods pass directly through the central region of the piezoelectric elements, it is easier to control the amount of mechanical stress applied and it is possible to achieve a higher amount of mechanical stress in the bender bar produced.

BRIEF DESCRIPTION OF THE DRAWINGS

The foregoing and other objects, aspects and advantages will be better understood from the following detailed description of the preferred embodiment of the invention with reference to the drawings, in which:

FIG. 4 is a plan view of a piezoelectric ceramic element on which a pair of electrodes is deposited;

FIG. 5 is a side view of the piezoelectric ceramic element shown in FIG. 4;

FIG. 6 is an isometric view of a monolaminar acoustic bender bar;

FIG. 7 is an exploded view of a piezoelectric element with a back electrode and conductive strip which are used in the monolaminar acoustic bender bar shown in FIG. 6;

DETAILED DESCRIPTION OF THE PREFERRED EMBODIMENTS OF THE INVENTION

Figure 1:
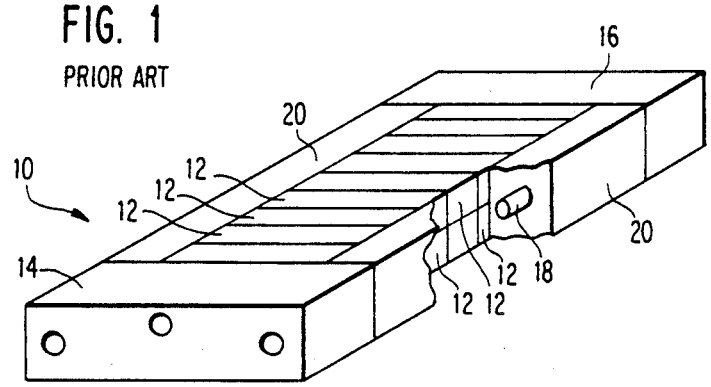
FIG. 1 is an isometric view of a prior art bilaminar bender bar.
Figure 2:
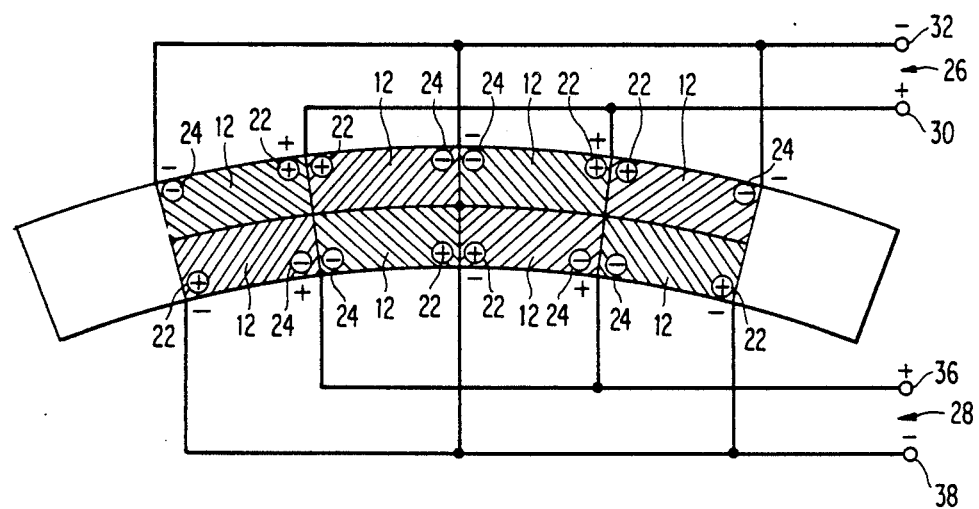
FIG. 2 is a partial cross-sectional side view of a prior art bilaminar bender bar showing electrical connections to the piezoelectric ceramic elements.
Figure 3:
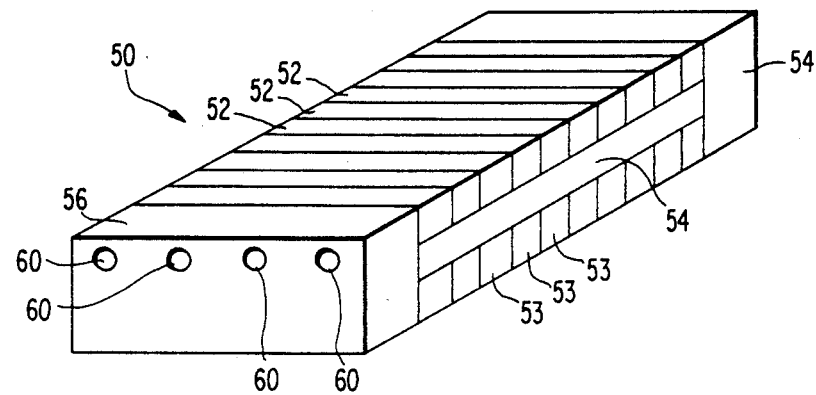
FIG. 3 is an isometric view of a prior art trilaminar bender bar.

Referring now to the drawings and more particularly to FIGS. 4 and 5, there is shown a piezoelectric ceramic element 100 on which two pairs of electrodes 102 and 104 are formed. The piezoelectric ceramic element 100 can be lead zironate titanate ($PbZrTiO_3$) or any other suitable material. The electrodes 102 and 104 can be made from silver and can be formed by sputtering, electrodeposition or any other suitable technique. The top section of the piezoelectric element 100 is poled in a first direction indicated by arrows 106, while the bottom section of the piezoelectric element 100 is poled in a second direction indicated by arrows 108 which is opposite the first direction. In each case, the arrows 106 and 108 indicate alignment of dipoles from the positive charge to the negative charge. By connecting a positive voltage to the electrodes 102 and 104 on the first side 110 of the piezoelectric ceramic element 100 and connecting a negative voltage to the electrodes 102 and 104 on the second side 112 of the piezoelectric ceramic element 100, the top half of the piezoelectric ceramic element 100 located between pair of electrodes 104 will expand and the bottom half of the piezoelectric ceramic element 100 located between pair of electrodes 102 will contract. A pair of openings 105 are drilled through the central region of the piezoelectric ceramic element 100 to accommodate stress rods passing therethrough as discussed below in conjunction with FIG. 6.

The device shown in FIGS. 4 and 5 is fabricated by first applying electrodes 104 to opposite sides of the top half of the piezoelectric ceramic element 100. Then the piezoelectric ceramic element 100 is heated to its Curie point temperature. The Curie point temperature for $PbZrO_3$ is 310° C. While at the Curie point temperature, a high, positive voltage is connected to the electrode on the first side 110 of the piezoelectric ceramic element 100 and a negative voltage is connected to the electrode on the second side 112, thereby poling the top half of the piezoelectric ceramic element 100 in the direction of arrows 106. Then the piezoelectric ceramic element 100 is cooled down and electrodes 102 are applied to opposite sides of the bottom half of the piezoelectric ceramic element 100. The piezoelectric ceramic element 100 is again heated to its Curie point temperature. While at the Curie point temperature, a high, positive voltage is connected to the electrode on the second side 112 of the piezoelectric ceramic element 100 and a negative voltage is connected to the electrode on the first side 110, thereby poling the bottom half of the piezoelectric ceramic element in the direction of arrows 106. The voltages applied to the piezoelectric ceramic element 100 during the poling process are typically on the order of 60 volts per millimiter thickness (60 V/mil).

The two step poling process described above allows the electrodes 102 and 104 positioned on each side 110 and 112 of the piezoelectric ceramic element 100 to be positioned very close together. An alternative poling process may include a single heating step where both sections are poled simultaneously at the Curie point temperature. If the two sections are poled simultaneously, the electrodes 102 and 104 must be spaced far enough apart on sides 110 and 112 that no current interference will occur. The spacing prevents the current between electrodes 102 from being received by electrodes 104.

FIG. 6 shows a monolaminar acoustic bender bar transducer 200 which comprises a stack of double poled piezoelectric ceramic elements 202 tightly held between end blocks 204 and 206. The double poled piezoelectric ceramic elements 202 are fabricated as described above in conjunction with FIGS. 4 and 5. A pair of stress rods 208 pass through the openings 105 in each piezoelectric ceramic element 202 and are secured in the end blocks 204 and 206. The stress rods 208 serve the purpose of holding the piezoelectric ceramic elements 202 tightly together. The piezoelectric ceramic elements 202 need to be tightly held together so that the bender bar will flex upon application of a voltage. If the piezoelectric ceramic elements 202 were loosely held together, the bender bar 200 may not flex as desired since the elements 202 would be free to move in a longitudinal direction. Since the stress rods 208 pass straight through the ceramic material of each element 202, it is easier to control the mechanical stress placed on each element 202 and it is possible to achieve a tighter configuration than if the stress rods were acting from a point exterior to the elements as is the case in bilaminar and trilaminar bender bars. The end blocks 204 and 206 include mounting holes 209 for securing the monolaminar bender bar 200 inside a hydrophone body or other acoustic instrument.

Insulative plastic pieces 210 can be placed at the ends of the stack of double poled piezoelectric elements 202 between the end blocks 204 and 206 to prevent the top and bottom piezoelectric elements 202 in the stack from being damaged by the end blocks 204 and 206. A suitable insulative plastic material 210 is MACOR which is sold by Dow Corning of New York. In addition to protecting the top and bottom piezoelectric elements 202, the insulative plastic pieces 210 prevent the end blocks 204 and 206, which are made of steel, from creating a short circuit between the electrodes 102 and 104 on the top and bottom double poled piezoelectric ceramic elements 202. The monolaminar bender bar 200 is also fitted with a pair of insulative plastic side rails 212 which have channels 214 running therethrough. The side rails 212 protect electrical connectors (not shown) which are used to apply voltages across each of the piezoelectric elements 202 in the bender bar 200.

FIG. 7 shows an exploded view of a double poled piezoelectric ceramic element 202 used in the monolaminar bender bar 200 shown in FIG. 6 together with an electrical connection plate 214 and electrical conductor 216. The double poled piezoelectric ceramic element 202 is fabricated according to the steps described above in conjunction with FIGS. 4 and 5 and comprises a piezoelectric ceramic material 100 on which two pairs of silver electrodes 102 and 104 are deposited. Indicator dots 218 and 220 are painted on the side of the ceramic material 100 to indicate the poling in the respective halves of the ceramic material 100. Setback areas 222 are created at the side regions of the electrodes 102 and 104 to aid in wiring to the electrodes 102 and 104. The electrical connection plate 214 is made of copper and includes central openings 224 through which the stress rods 208 of the bender bar 200 will pass. The electrical connection plate 214 forms an electrical connection with the electrodes 102 and 104 formed on one side of the piezoelectric ceramic material 100 when the elements are tightened together. A positive or negative voltage is applied to the electrical connection plate 214 by the conductor 216 being connected to the tab region 215 on the electrical connection plate 214. The positive or negative voltage is transmitted to the electrodes 102 and 104 on the piezoelectric ceramic material 100; thereby causing one half of the ceramic material 100 to expand and the other half to contract.

Figure 8:
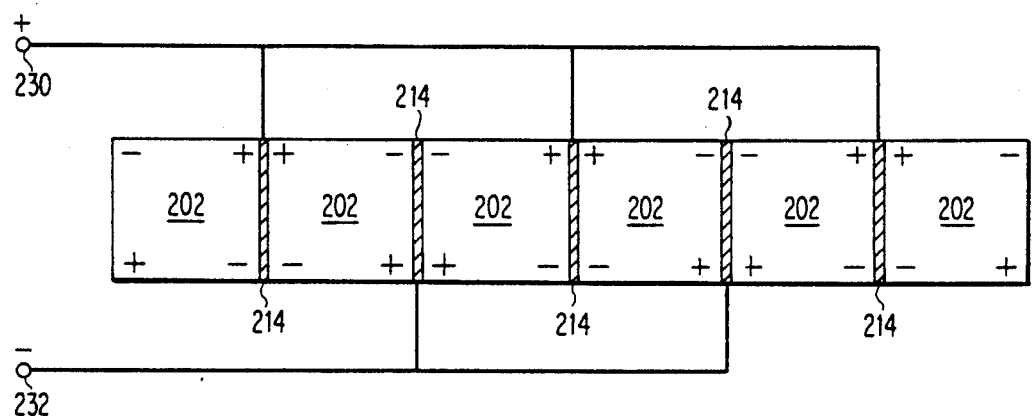
FIG. 8 is a partial cross-sectional side view of the stack of double poled piezoelectric elements used in the bender bar shown in FIG. 6 showing the electrical connections to each element.
Figure 9:
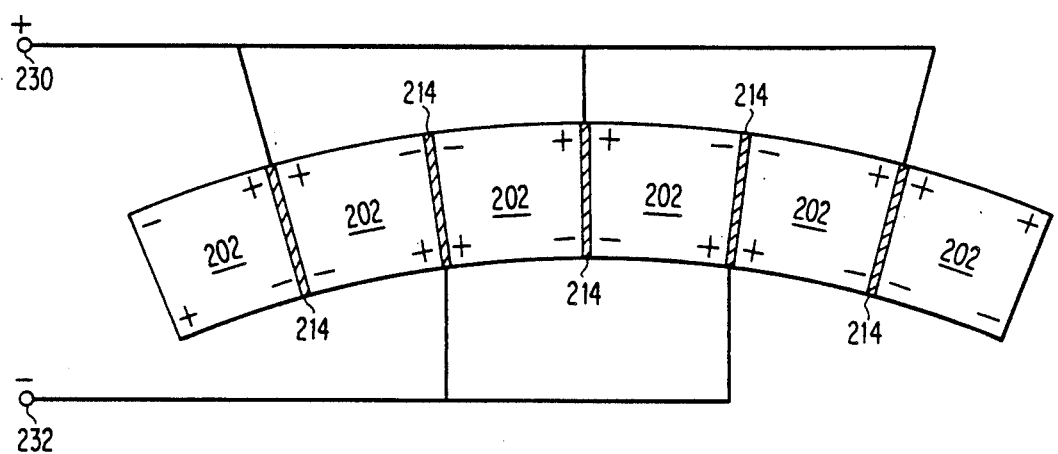
FIG. 9 is a partial cross-sectional side view of the stack of double poled piezoelectric ceramic elements shown in FIG. 8 showing bending of the stack under an applied voltage.

FIGS. 8 and 9 illustrate the bending imparted to the stack of double poled piezoelectric ceramic elements 202 shown in FIG. 6 under an applied voltage. As described in conjunction with FIG. 7, a copper electrode 214 contacts the silver electrodes on one side of each piezoelectric ceramic element 202 in the stack. The positive terminal 230 and negative terminal 232 of a power source are connected to alternate copper electrodes 214 in the stack. The piezoelectric ceramic elements 202 are arranged in the stack with oppositely poled top and bottom sections in adjacent elements 202. When current is applied, the top portion of each element 202 in the stack expands while the bottom portion of each element in the stack contracts; thereby causing the stack to flex upwardly as shown in FIG. 9.

While the invention has been described in terms of a bender bar acoustic transducer which consist of a single stack of double poled piezoelectric elements, those in the art will recognize that the design of the piezoelectric elements and their orientation in the stack and electrical connections to each element can be modified within the spirit and scope of the appended claims.

Having thus described our invention, what we claim as novel and desire to secure by Letters Patent is the following:

1. An acoustic bender bar transducer, comprising:
    a single stack of double poled piezoelectric ceramic elements, each double poled piezoelectric ceramic element having a first portion poled from a first side to a second side of said double poled piezoelectric ceramic element and a second portion poled from said second side to said first side of said double poled piezoelectric ceramic element; and
    means for connecting a positive voltage to said first side and a negative voltage to said second side of each double poled piezoelectric ceramic element, said piezoelectric ceramic elements being stacked such that said first and second poled portions of adjacent double poled piezoelectric ceramic elements are in reverse orientation, whereby connection of said positive voltage and said negative voltage causes said stack to bend.

2. The acoustic bender bar transducer recited in claim 1 wherein said means for connecting positive and negative voltages comprises electrical connection plates positioned between adjacent double poled piezoelectric ceramic elements in said stack and positive and negative electrical conductors oriented longitudinally on said stack, said positive electrical conductor being connected to a first set of electrical connection plates and said negative electrical conductor being connected to a second set of electrical connection plates.

3. The acoustic transducer recited in claim 2 wherein said first and second sets of electrical connection plates are interleaved between adjacent piezoelectric ceramic elements.

4. The acoustic bender bar transducer recited in claim 1 further comprising at least one stress rod passing through a bore in each of said double poled piezoelectric ceramic elements, said stress rod serving to hold said double poled piezoelectric ceramic elements in said stack tightly together.

5. The acoustic bender bar transducer recited in claim 4 wherein said bore in each of said double poled piezoelectric ceramic elements is positioned between said first and second poled portions of said double poled piezoelectric ceramic element.

* * * * *